United States Patent
Arai et al.

(12) 
(10) Patent No.: US 6,841,866 B2
(45) Date of Patent: Jan. 11, 2005

(54) POWER SEMICONDUCTOR DEVICE (75) Inventors: Kiyoshi Arai, Tokyo (JP); Nobuhisa Honda, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 47 days.

(21) Appl. No.: 10/339,289

(22) Filed: Jan. 10, 2003

(65) Prior Publication Data

US 2004/0007772 A1 Jan. 15, 2004

(30) Foreign Application Priority Data

Jul. 15, 2002 (JP) ........................................ 2002-205646

(51) Int. Cl.$^7$ ........................ H01L 23/14; H01L 23/10; H01L 23/34; H01L 23/48; H01L 23/52
(52) U.S. Cl. ...................... 257/702; 257/707; 257/723; 257/777; 438/109; 438/931
(58) Field of Search ................................ 257/702, 707, 257/723, 777; 438/109, 931

(56) References Cited

U.S. PATENT DOCUMENTS

| 3,715,636 A | * | 2/1973 | Jaffe et al. | ..................... 257/76 |
| 5,295,044 A | * | 3/1994 | Araki et al. | ................ 361/709 |
| 6,084,308 A | * | 7/2000 | Kelkar et al. | ............... 257/777 |
| 2003/0205806 A1 | * | 11/2003 | Chang et al. | ............... 257/725 |

FOREIGN PATENT DOCUMENTS

| JP | 11-510000 | 8/1999 |
| JP | 11-274482 | 10/1999 |
| WO | WO 97/01209 | 1/1997 |

* cited by examiner

Primary Examiner—Craig A. Thompson
Assistant Examiner—Nema Berezny
(74) Attorney, Agent, or Firm—Oblon, Spivak, McClelland, Maier & Neustadt, P.C.

(57) ABSTRACT

A power semiconductor device includes a portion and an external package enclosing the portion. The portion includes a ceramic board sides provided on the ceramic board defining a space filled with a thermal insulator, and a silicon carbide power semiconductor element enclosed within the thermal insulator. The external package is made of a material having a thermal conductivity lower than that of the side.

11 Claims, 10 Drawing Sheets

POWER SEMICONDUCTOR DEVICE

BACKGROUND OF THE INVENTION

1. Field of the Invention

The present invention relates to a power module including a power semiconductor element.

2. Description of the Background Art

Figure 1A:
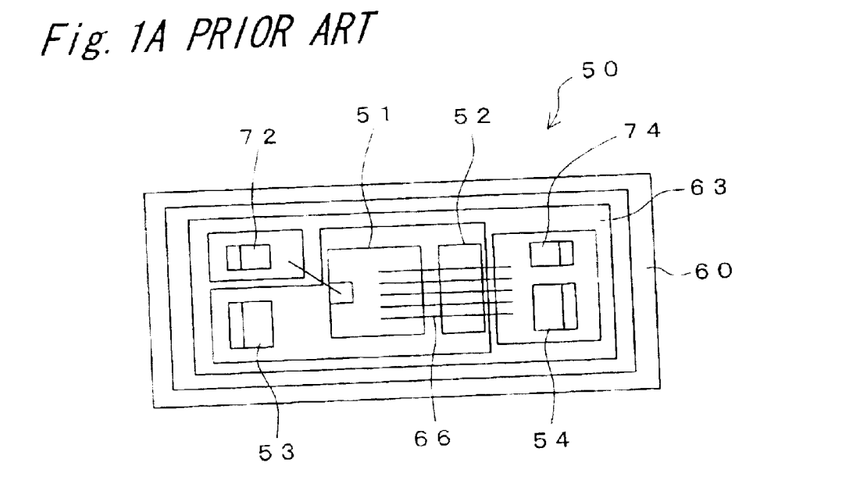
FIG. 1A is a plan view of a conventional power semiconductor device.
Figure 1B:
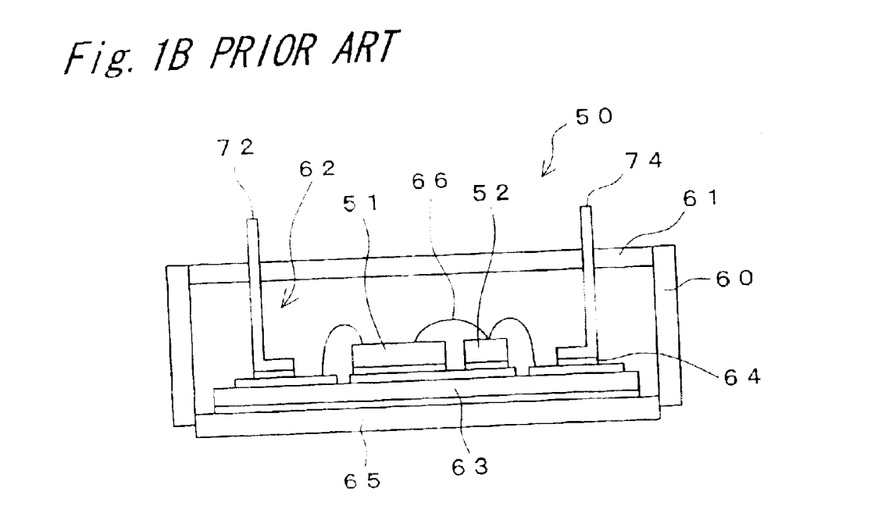
FIG. 1B is a front view of the conventional power semiconductor device of FIG. 1A.

The power semiconductor device is generally constructed to as a power module. The power module has a power semiconductor element, e.g. a power metal oxide semiconductor field effect transistor (hereinafter referred to as MOS FET), an Insulated Gate Bipolar Transistor (hereinafter called to as IGBT), or a diode, based on silicon. As shown in FIGS. 1A and 1B, a conventional power semiconductor device 50 includes a heat sink plate 65, and a ceramic plate 63 with a circuit pattern mounted thereon. Silicon-based power semiconductor elements 51, 52 are mounted on the ceramic plate 63, and are soldered or wired by aluminum wires 66, such that a circuit will be constructed. The power semiconductor elements 51, 52 are connected to external terminals, e.g. a collector terminal 53, an emitter terminal 54, a control signal terminal 72, and an emitter signal terminal 74. The power semiconductor device 50 has a case including the heat sink 65, a side plate case 60, a top cover 61, and gel 62 fills the case.

A silicon-carbide-based semiconductor element (hereinafter referred to as silicon carbide semiconductor element) is used practically instead of the silicon-based semiconductor element. The rated temperature of the silicon-carbide-based semiconductor element is over 150° C. In fact, the element is able to be operated up to about 300° C.

The elements of the power semiconductor device, e.g. an IGBT, a flywheel diode, are connected to the circuit pattern by soldering. Therefore, when the device is heated up to a temperature higher than 150° C., especially 300° C., the solder connecting between the elements is melted. On stopping the device, the solder solidifies. Therefore, if operating and stopping will repeat one after the other, connecting region will deteriorate because of repetition of melting and solidifying. On the other hand, the emitter electrode and the gate electrode are connected by aluminum wire. An excessive stress is generated on wire bonding because the temperature deference between on operating and on stopping may increase. Then, the connecting region will deteriorate. The temperature of the heat sink plate 65 become a temperature of 300° C. in the conventional package, so that the whole of the power semiconductor device has a high temperature. When the power semiconductor device is embedded in a inverter, the temperature of other circumference component of the inverter will be increased so that life of the inverter will be shortened.

A printed wiring board for power electronics is called as power board. When the temperature of a power semiconductor element mounted on the power board increases, the temperature of the power board will be increased. Since the power board has a weakness for high temperature, it is necessary that the temperature of the connection portion between the element and the printed wiring board should be avoid to become high. Further, heat conduction between the high temperature side and low temperature side should be suppressed.

SUMMARY OF THE INVENTION

It is, therefore, an object of the present invention to provide a power semiconductor device having an power semiconductor element based on silicon carbide such that heat conduction from higher temperature region to lower temperature region can be suppressed.

In accordance with one aspect of the present invention, there is provided a power semiconductor device including a portion and an external package. The portion includes a ceramic board, a side provided on the ceramic board, which defines a space filled with a thermal insulator, and a silicon-carbide power semiconductor element enclosed within the thermal insulator. The external package is made of a material having a thermal conductivity lower than that of the side, and that encloses the portion.

In another aspect of the present invention, there is provided a power semiconductor device including first portion and second portion. The first portion includes a power semiconductor element based on silicon carbide. The second portion includes a power semiconductor element based on silicon, and is electrically connected to the first portion. The first and second portions are packaged.

According to the power semiconductor device of the present invention, since the external package is made of the material having a low thermal conductivity, so that the surface temperature of the external package can be suppressed. Therefore, the size of the power semiconductor device can be reduced.

BRIEF DESCRIPTION OF THE DRAWINGS

The present invention will become readily understood from the following description of preferred embodiments thereof made with reference to the accompanying drawings, in which like parts are designated by like reference numeral and in which.

DETAILED DESCRIPTION OF THE PREFERRED EMBODIMENTS

A power semiconductor device according to preferred embodiments of the present invention is described below with reference to the accompanying figures.

Figure 2A:
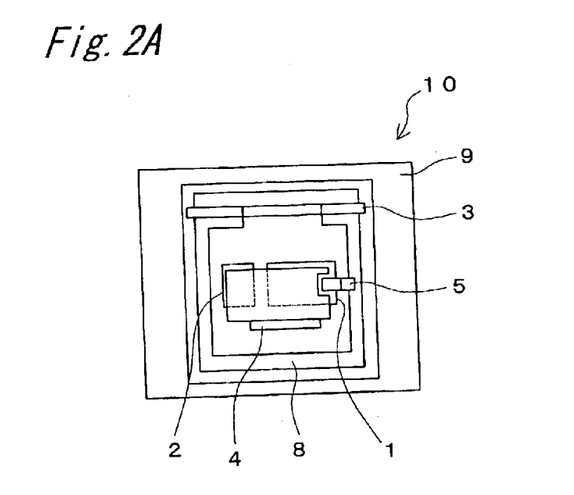
FIG. 2A is a plan view of a power semiconductor device of the first embodiment of the present invention.
Figure 2B:
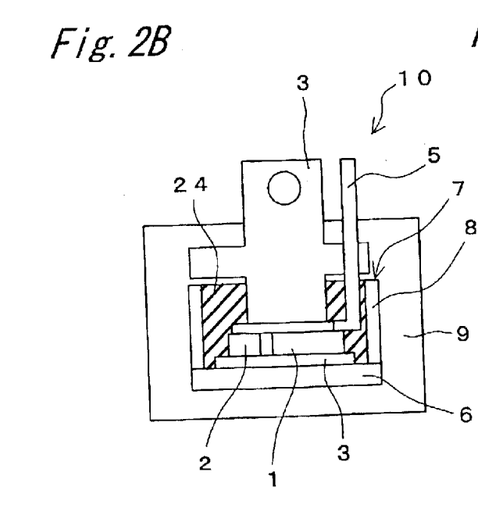
FIG. 2B is a front view of the power semiconductor module of FIG. 2A.
Figure 2C:
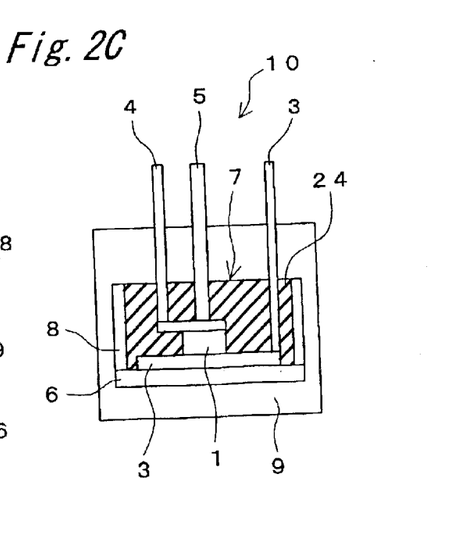
FIG. 2C is a side view of the power semiconductor device of FIG. 2A.

FIG. 2A is a plan view of a power semiconductor device of the first embodiment of the present invention. FIGS. 2B and 2C are a front view and a side view of the power semiconductor module of FIG. 2A. The power semiconductor device 10 includes a portion 7 having power semiconductor elements 1, 2 based on silicon carbide with plastic resin 24 filled in the portion 7, and an external package 9 covering the portion 7. Because the external package 9 is made of a material having a thermal conductivity lower than that of an inner side 8 of the portion 7, the surface temperature thereof may be decreased. Further, the size of the power semiconductor device 10 can be minimized. It is to be noted that the plastic resin 24 has a thermal conductivity lower than the external package 9. Because the power semiconductor element based on silicon carbide has rated temperature higher than 150° C., the portion 7 can be operated at a temperature higher than 150° C. The portion 7 is wrapped in the external package 9. The external package 9 is isolated thermally from the portion 7 by the thermal insulator. Therefore, heat conduction from the portion 7 to the external package 9 can be decreased. It is noted that the external package is made of a thermal insulator material having a thermal conductivity of preferably not higher than 10 W/(m·K), more preferably not higher than 2 W/(m·K). Furthermore, the thermal insulator material may be epoxy resin.

Next, we will explain the power semiconductor elements 1, 2 based on silicon carbide. The power semiconductor elements 1, 2 have a low loss on operating at a temperature not lower than 150° C., and even not lower than 300° C. Then, when the power semiconductor elements 1, 2 has a small chip size, they can be operated at higher temperature with low loss, even though the elements are heated themselves. Please note that the element based on silicon is guaranteed to be operated at a temperature not higher than 125° C. Further, rated temperature thereof is equal to 150° C. If the element will be operated at a temperature higher than 150° C., the power loss of the element will be significantly increased. Generally, the chip size of a conventional semiconductor element is enlarged so that the temperature thereof can be low even if it is heated.

Next we will explain a relationship between a size and heating of the power semiconductor element. Since the power semiconductor element is operated on a condition to provide a large current and on high voltage, the element is significantly heated itself, so that the element has a heat sink connected on a backside thereof. In the thermal conduction from the power semiconductor elements 1, 2 to the heat sink, the temperature of the element is determined by the thermal resistance. The direction of the heat conduction is, e.g. a first direction along a perpendicular direction with respect to the surface of the backside of the element, a second direction lateral to the backside surface. The heat conduction along the first direction depends on the material between the backside surface and the heat sink and the thickness thereof. The heat conduction along the second direction depends on an area for thermal diffusion of the components, specifically on a size of the element. Since a smaller amount of heat is transferred from the element to the outside, as the element has a smaller area, so that the element is subjected to reaching a higher temperature.

Next, we explain how the power semiconductor elements 1, 2 are mounted. The elements 1, 2 are mounted onto the portion of the collector electrode 3 in the portion 7 by pressure connection. The pressure connection does not need any solder so that the element can be operated at a temperature higher than 150° C., or further at a temperature higher than 300° C. For example, when the portion 7 is fabricated by using transfer molding, the molding is performed under a die pressure so that the power semiconductor elements 1, 2 are connected by pressure. Please note that the connection method is not limited to the pressure connection, if any other connection method has heat resistance on the operating temperature. The power semiconductor element may be connected by any other connection method, e.g. a connection by using a hard solder, except for the under pressure connection. A conical spring may be secondarily used. Alternatively a ribbon electrode may be connected on the both sides of the element by ultrasonic bonding. Alternatively the elements may be clamped by screws.

The structure of electrodes 3, 4 will be explained as follows. Referring to FIG. 2A, the collector electrode 3 has a partially widened portion between a portion near the portion 7 and a connecting portion to an external device. It is noted that an emitter electrode may have same electrode structure as the collector electrode 3. Then, heat conducted from the portion 7 to the external package 9 and to the connecting to the external device can be radiated from the widened portion, so that heat conduction to the low temperature side can be decreased. The collector electrode 3 and the emitter electrode 4 are generally made of copper having a high electric conductivity.

Since the insulation of molded resin in the power semiconductor device 10 will be deteriorated with time, a ceramic board 6 is used to secure a predetermined electrical insulation.

A fabricating process of the power semiconductor device 10 will be explained. The power semiconductor device 10 is fabricated as follows.

(a) The power semiconductor elements 1, 2 are arranged in the portion 7 by pressure connection. A resin 24 is filled in the portion 7. When transfer molding method is used, the molding is under the die pressure so that the power semiconductor element 1, 2 are connected by pressure.

(b) Next, the molding is performed to enclose the portion 7 to form in the external package 9. In this case, the external package 9 has a thermal conductivity lower than the side 8 of the portion 7. The external package 9 is made of a resin having a thermal conductivity lower than that of the side, so that the thickness thereof can be decreased.

Then, the power semiconductor device 10 fabricated as mentioned above thermal insulator between the portion 7 and the external package 9. Therefore, heat conduction from the portion 7 to the external package 9 can be decreased.

Figure 3A:
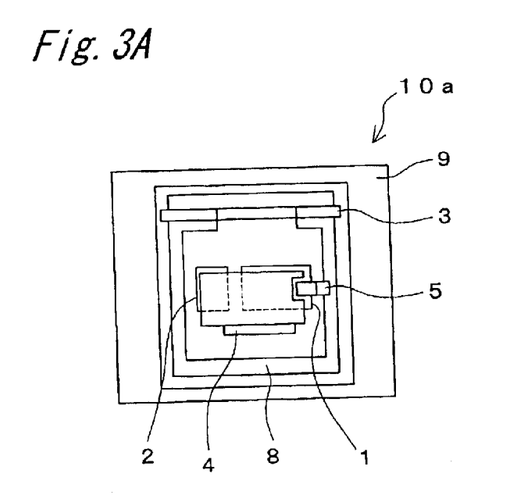
FIG. 3A is a plan view of a power semiconductor device of the second embodiment of the present invention.
Figure 3B:
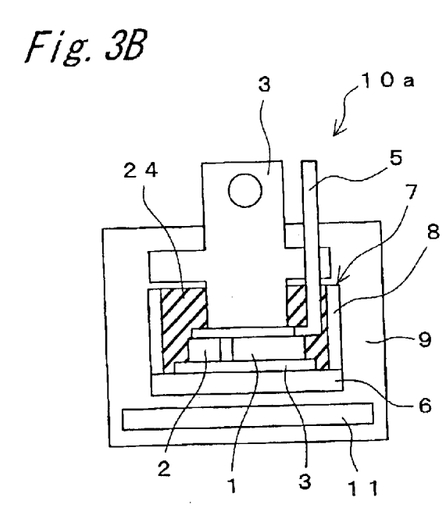
FIG. 3B is a front view of the power semiconductor module of FIG. 3A.
Figure 3C:
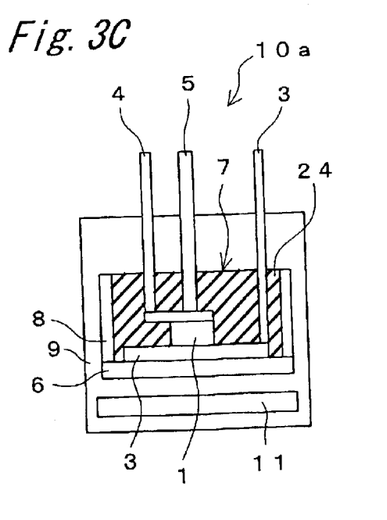
FIG. 3C is a side view of the power semiconductor device of FIG. 3A.

FIG. 3A is a plan view of a power semiconductor device 10a of a second embodiment of the present invention. FIGS. 3B and 3C are a front view and a side view thereof. As compared with the power semiconductor device of the first embodiment, the device differs in that a thermal buffer plate 11 is provided within the external package 9 wrapping the portion 7, as shown in FIGS. 3B and 3C. Heat conducting from the portion 7 to the external package 9 is absorbed by the thermal buffer plate 11. Since the external package 9 including the thermal buffer plate 11 have large heat resistance, heat conduction from a transistor 1 based on silicon carbide and a diode 2 based on silicon carbide to outside can be suppressed. Heat can be pooled in the thermal buffer plate 11, so that the heat can hardly conduct to outside. For example, when the thermal buffer plate is not used, surface temperature of the device is 80° C. with respect to 100° C. of internal temperature of the second portion 8. On the other hand, when the thermal buffer plate is used, surface temperature of the device can be reduced to 60° C. Please note that a metal material, .e.g. silver, copper, and a ceramic material, e.g. alumina may be used in the thermal buffer plate.

Figure 4A:
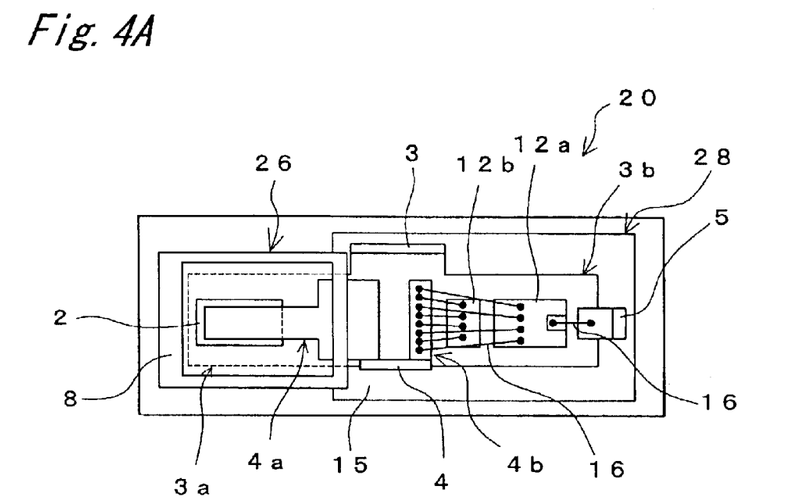
FIG. 4A is a plan view of a power semiconductor device of the third embodiment of the present invention.
Figure 4B:
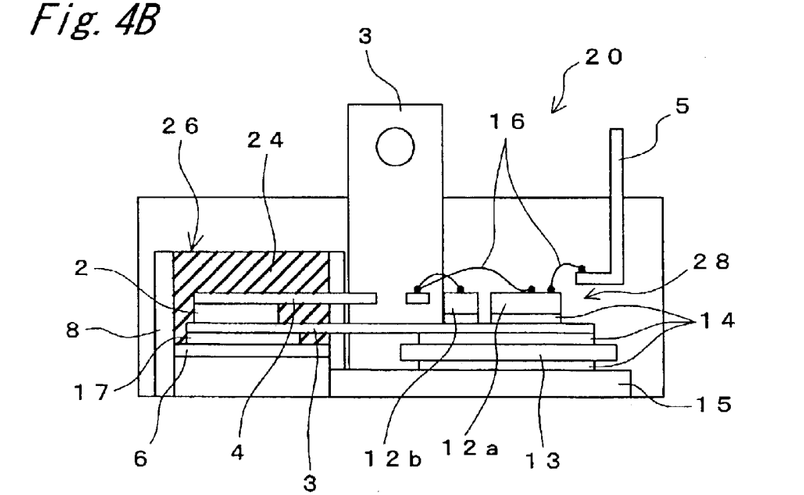
FIG. 4B is a front view of the power semiconductor device of FIG. 4A.

FIG. 4A is a plan view of a power semiconductor device 20 of a third embodiment of the present invention, and FIG. 4B is a front view thereof. As compared with the power semiconductor device of the first embodiment, the device 20 differs in that a first portion 26 and a second portion 28 are arranged in parallel with each other, as shown in FIGS. 4A and 4B. The first and second portion are packaged in an external package. The power semiconductor device 20 has a collector electrode 3 and an emitter electrode 4 that are extended from the first portion 26 to the second portion 28. The first portion 26 has a ceramic board 6, and a side 8 enclosing the ceramic board 6. The side 8 defines a space filled with a plastic resin. The silicon carbide power semiconductor element 2 is enclosed within the plastic resin 24, and is operable at a temperature higher than 150° C. The silicon carbide semiconductor element 2 is mounted onto a portion 3a of the electrodes. The portion 3a is contacted to a ceramic board 6 via a solder 17. The silicon carbide semiconductor element 2 is enclosed within the plastic resin 24.

The second portion 28 includes power semiconductor elements 12a, 12b based on silicon. The silicon semiconductor elements 12a, 12b of the second portion 28 are mounted onto a portion 3b of the electrode 3 via solder 14. The silicon transistor 12a is connected to the emitter electrode 4 and the gate electrode 5 by aluminum wires 16. Also, the silicon diode 12b is connected to the emitter electrode 4 by aluminum wire 16. The silicon semiconductor elements 12a, 12b are operable at a temperature lower than 150° C. The first and second portions 26, 28 may have a thermal insulator between them. Then, heat conduction from the first portion 26 to the second portion 28 can be decreased. The collector electrode 3 is connected to a ceramic board 13 via a solder 14. Further, the ceramic board 13 is contacted to a heat sink plate 15 via a solder 14. The heat sink plate 15 has non-contact with the ceramic board 6 of the first portion 26. It is to be noted that a heat sink plate 15 acts as heat radiator from the second portion 28 to outside.

Figure 5:
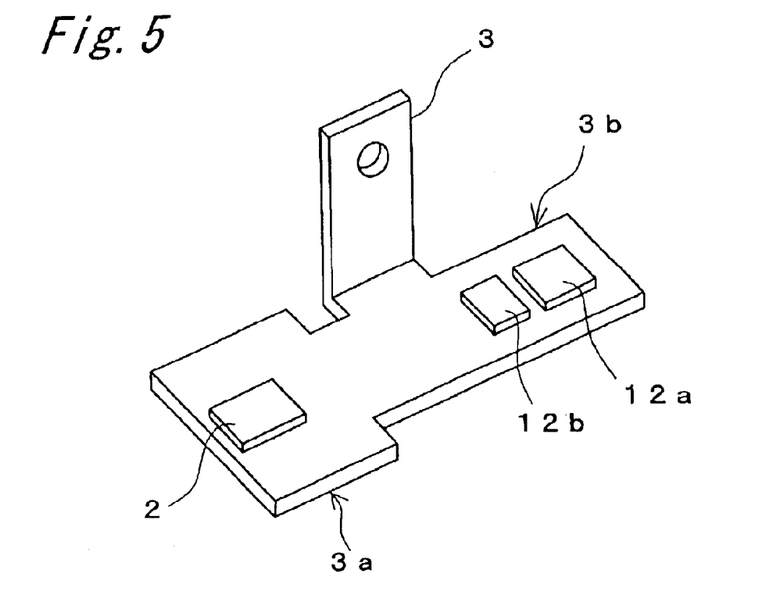
FIG. 5 is a perspective view of collector electrode of FIG. 4A.
Figure 6:
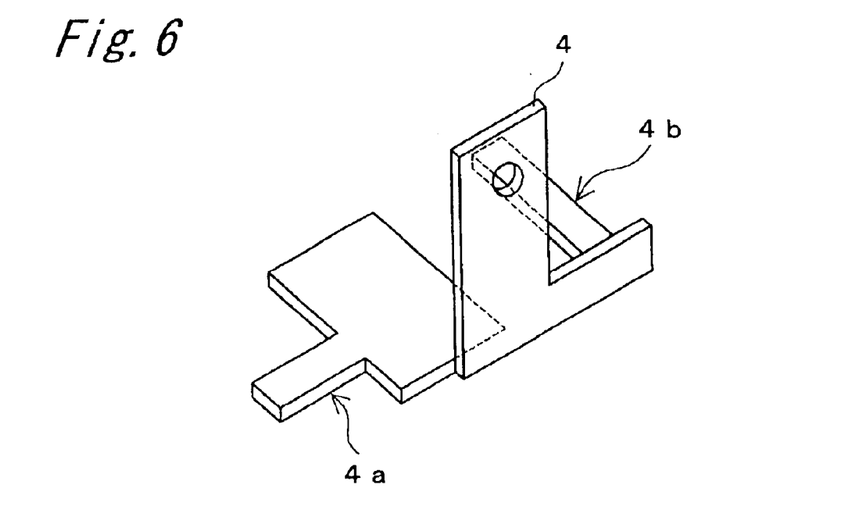
FIG. 6 is a perspective view of emitter electrode of FIG. 4A.

FIG. 5 is a perspective view of an arrangement of a collector electrode 3. FIG. 6 is a perspective view of an arrangement of a emitter electrode 4. The silicon carbide semiconductor element 2 is provided on the collector electrode 3a of the first portion 26. The silicon semiconductor element 12a, 12b are extending on the collector electrode 3b the second portion 28. The emitter electrode 4 has a ctenoid or comb-shaped terminal 4a on the first portion 26 side, and a terminal 4b for wire-bonding of aluminum wire on the second portion 28 side.

Figure 7A:
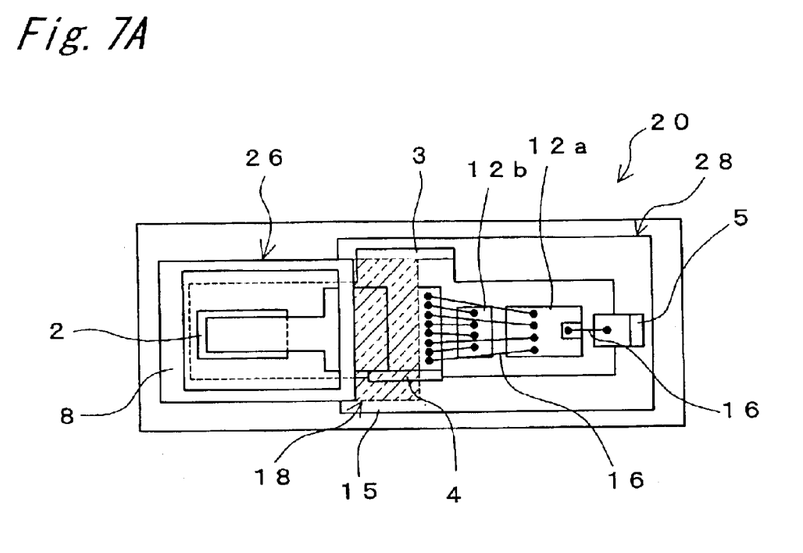
FIG. 7A is a plan view of first and second portions of the power semiconductor device of the third embodiment of the present invention.

Referring to FIG. 7A, a power semiconductor of other aspect of the present invention includes a thermal insulating portion 18 made of molded resin between the first and second portions. Then, the heat conduction from the first portion 26 to second portion 28 can be suppressed by the thermal insulating portion 18. The thermal insulating portion 18 acts as heat pooling and heat radiator from the first portion 26, so that the heat conduction to the second portion 28 can be suppressed.

Figure 7B:
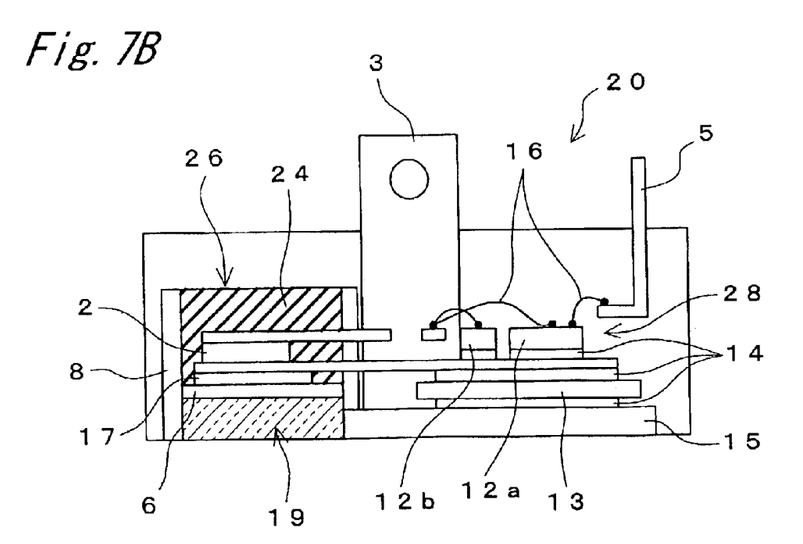
FIG. 7B is a front view of the FIG. 7A.

Further, referring to FIG. 7B, a power semiconductor of another aspect of the present invention includes a low conduction portion 19 having a low thermal conductivity molded between the first portion 26 and the heat sink plate 15. The heat sink plate 15 acts as heat radiator from the second portion 28. Preferably, the low thermal conduction portion 19 has a thermal conductivity not higher than 10 W/(m·K), more preferably 2 W/(m·K). The low conduction portion 19 may be made of epoxy resin. The heat conduction from the first portion 26 to the second portion 28 through the heat sink plate 15 can be suppressed.

Figure 8A:
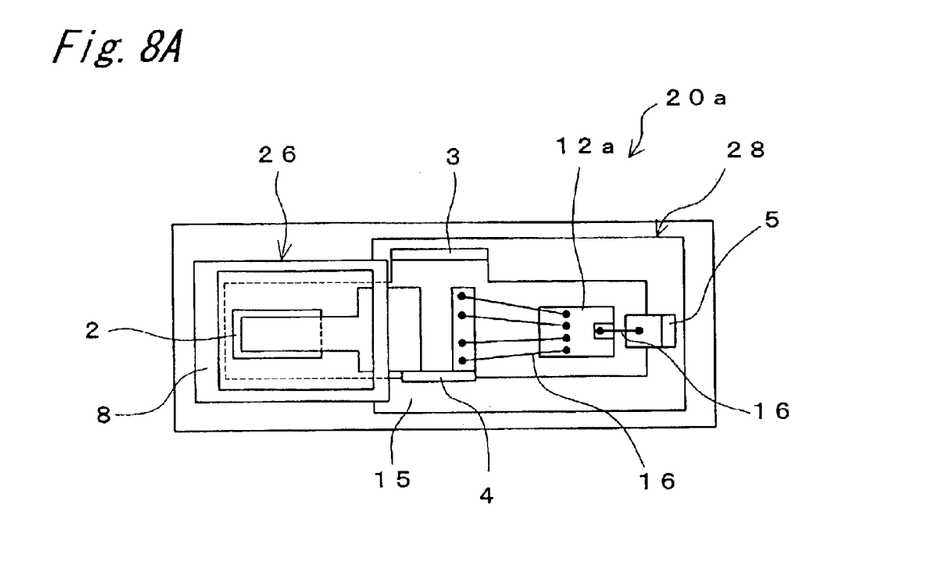
FIG. 8A is a plan view of a power semiconductor device of the fourth embodiment of the present invention.
Figure 8B:
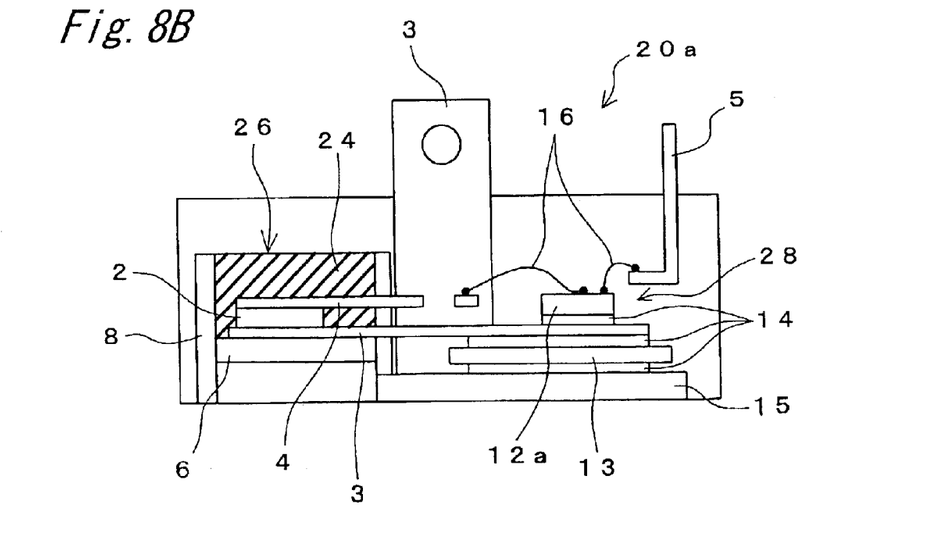
FIG. 8B is a front view of the power semiconductor device of FIG. 8A.

FIG. 8 shows a power semiconductor device 20a of the fourth embodiment of the present invention. As compared with the power semiconductor device of the third embodiment, the both differ from each other in that only transistor 12a based on silicon is mounted on the second portion 28 side. Please note that any other combination of elements can be selected.

Figure 9A:
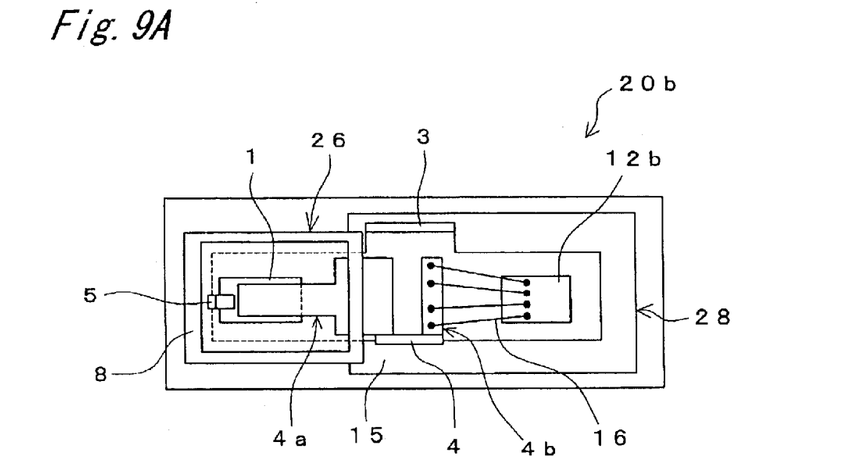
FIG. 9A is a plan view of a power semiconductor device of the fifth embodiment of the present invention.
Figure 9B:
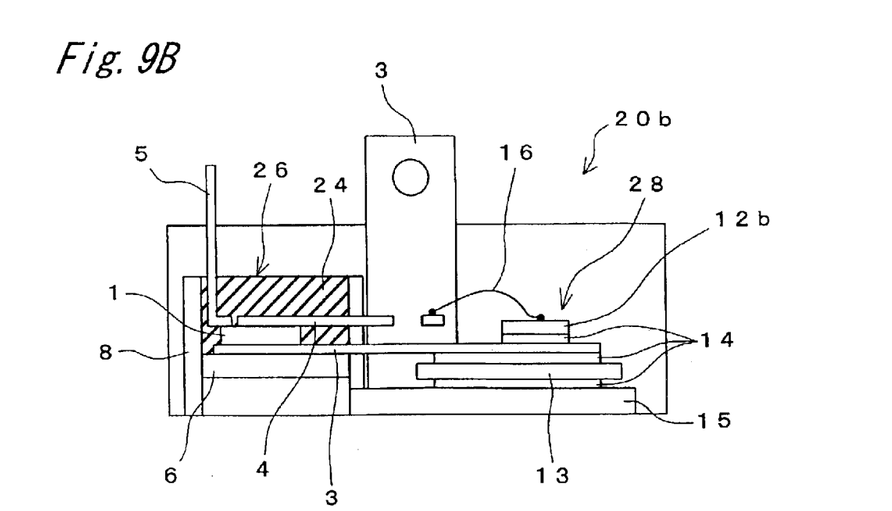
FIG. 9B is a front view of the power semiconductor device of FIG. 9A.

FIG. 9 shows a power semiconductor device 20b of the fifth embodiment of the present invention. As compared with the power semiconductor device of the fourth embodiment, the both differ from each other in that a silicon carbide transistor 1 is mounted on the first portion 26 side, and is connected to an emitter electrode 4 and a gate electrode 5. Also, a silicon diode 12b is mounted on the second portion 28 side. Since the transistor 1 based on silicon carbide has a smaller size than the transistor based on silicon, the size of the power semiconductor device can be reduced.

Figure 10A:
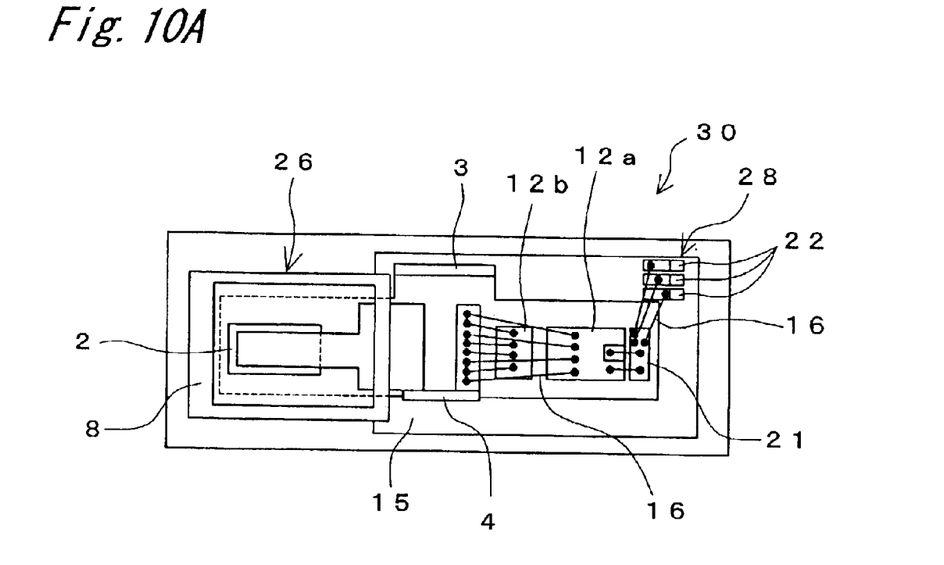
FIG. 10A is a plan view of a power semiconductor device of the sixth embodiment of the present invention.
Figure 10B:
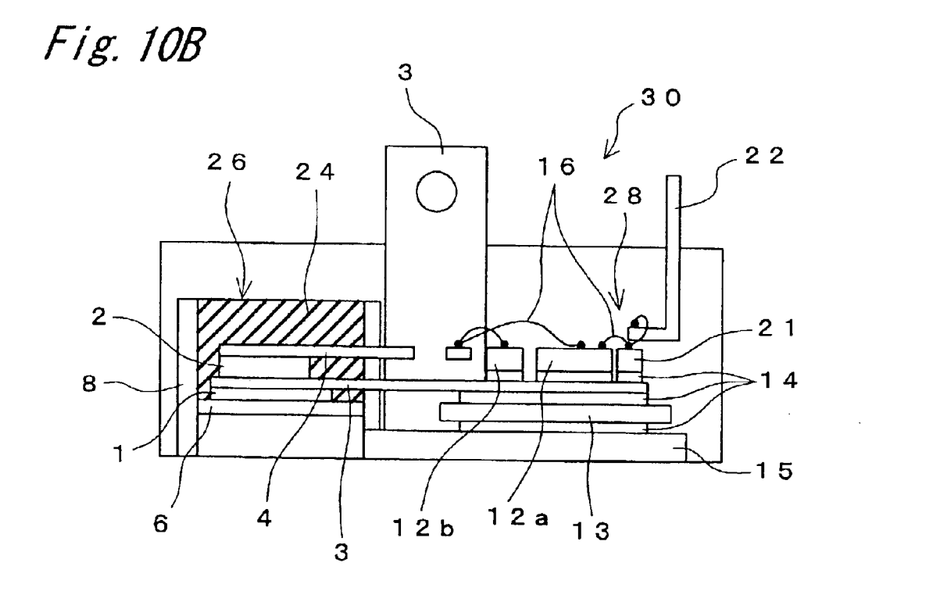
FIG. 10B is a front view of the power semiconductor device of FIG. 10A.

FIG. 10 shows a power semiconductor device 30 of the sixth embodiment of the present invention. As compared with the power semiconductor device 30 of the third embodiment, the device 30 differs in that a controlling element 21, e.g. an integrated circuit (IC) controlling the power semiconductor element is mounted on the collector electrode 3 via a solder 14. The controlling element 21 is connected to the silicon transistor 12a and a terminal 22 for control signal. Then hybrid module including the silicon carbide semiconductor element and the silicon semiconductor element can be realized by using conventional intelligent power-module technique.

Figure 11A:
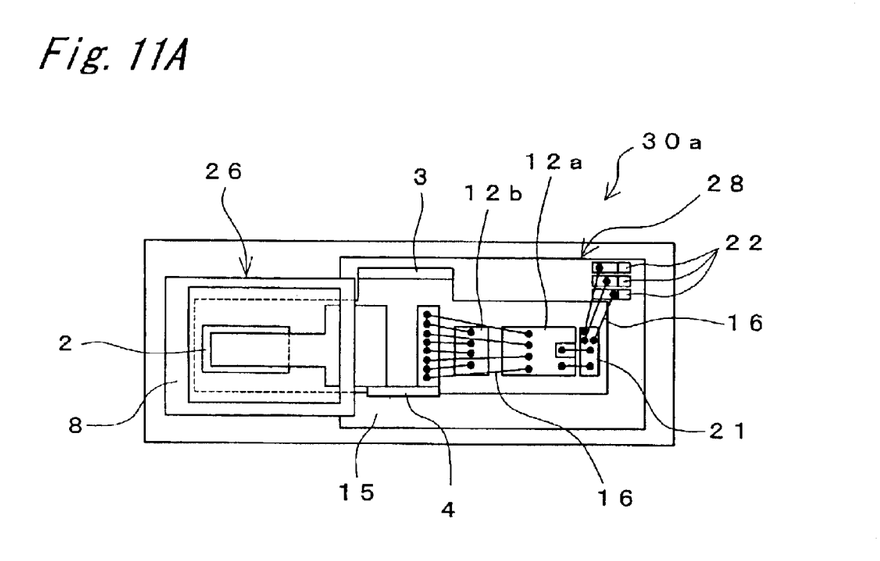
FIG. 11A is a plan view of a power semiconductor device of the seventh embodiment of the present invention.
Figure 11B:
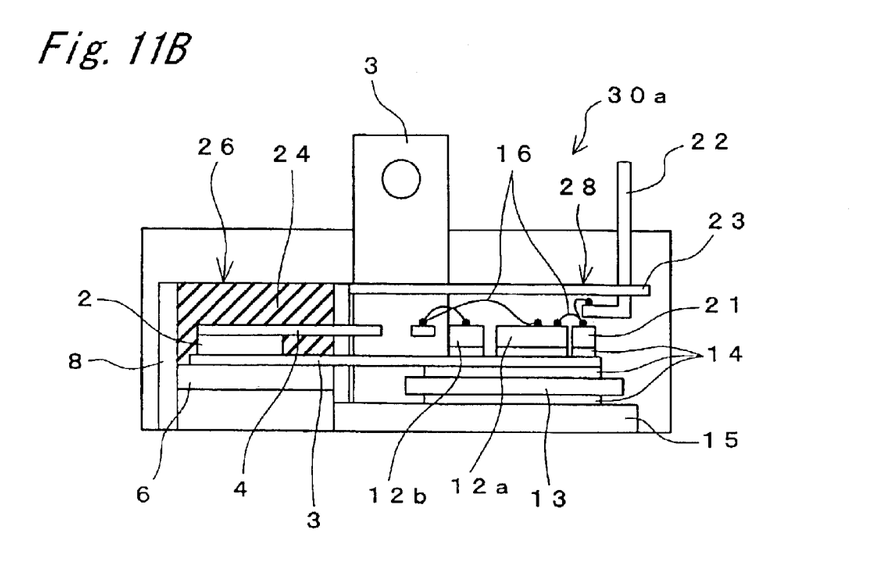
FIG. 11B is a front view of the power semiconductor device of FIG. 11A.

FIG. 11 shows a power semiconductor device 30a of the seventh embodiment of the present invention. As compared with the power semiconductor device of the sixth embodiment, the both differ from each other in that a printed wiring board 23 is included. The parts are mounted on the printed wiring board 23. According to adding and changing the printed wiring board, so that any functional variation can be easily added to the power semiconductor device.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A power semiconductor device, comprising:
   a portion, comprising:
      a ceramic board;
      a plurality of sides provided on the ceramic board, the plurality of sides and the ceramic board defining a space filled with a thermal insulator; and
      a silicon-carbide power semiconductor element enclosed within the thermal insulator; and
   an external package enclosing the portion, wherein a thermal conductivity of the external package is lower than a thermal conductivity of the plurality of sides.

2. The power semiconductor device according to claim 1, wherein the thermal insulator has a thermal conductivity lower than the thermal conductivity of the external package.

3. The power semiconductor device according to claim 1, wherein the external package comprises a thermal buffer element having a specific heat higher than a specific heat of the external package.

4. A power semiconductor device, comprising:
   an electrode;
   a first portion, comprising:
      a ceramic board;
      a plurality of walls in communication with the ceramic board forming a space filled with a plastic resin; and
      a silicon carbide power semiconductor element mounted to the electrode in the space filled with the plastic resin; and
   a second portion comprising a silicon power semiconductor element, the silicon power semiconductor element being mounted to the electrode outside said space and connected to the silicon carbide power semiconductor, wherein the first and second portions are packaged.

5. The power semiconductor device according to claim 4, further comprising a thermal insulator provided between the first portion and the second portion.

6. The power semiconductor device according to claim 5, wherein the thermal insulator is made of a plastic resin.

7. The power semiconductor device according to claim 4, further comprising:
   a heat sink contacting the silicon power semiconductor element of the second portion to radiate heat there from, wherein the heat sink has a non-contact with the silicon carbide power semiconductor element of the first portion.

8. The power semiconductor device according to claim 4, further comprising:
   a heat sink that radiates heat from said second portion, and a heat transmittance region having a thermal conductivity lower than 10 W/(m·K) provided between the first portion and the heat sink.

9. The power semiconductor device according to claim 4, wherein the electrode has a partially widened region.

10. The power semiconductor device according to claim 4, wherein the silicon carbide power semiconductor device is mounted onto the electrode by pressure connection.

11. The power semiconductor device according to claim 4, wherein the silicon carbide power semiconductor element is a transistor or a diode.

* * * * *